United States Patent

Cho et al.

[11] 4,186,410
[45] Jan. 29, 1980

[54] NONALLOYED OHMIC CONTACTS TO N-TYPE GROUP III(A)-V(A) SEMICONDUCTORS

[75] Inventors: Alfred Y. Cho, Summit; James V. Di Lorenzo, Millington; William C. Niehaus, Murray Hill, all of N.J.

[73] Assignee: Bell Telephone Laboratories, Incorporated, Murray Hill, N.J.

[21] Appl. No.: 919,624

[22] Filed: Jun. 27, 1978

[51] Int. Cl.$^2$ .................... H01L 29/80; H01L 23/48; H01L 29/46
[52] U.S. Cl. .................... 357/67; 357/22; 357/65; 357/71; 29/589; 29/590; 427/82; 427/91
[58] Field of Search .............. 357/65, 67, 71, 22; 29/589, 590, 591; 427/82, 91

[56] References Cited

U.S. PATENT DOCUMENTS

| | | | |
|---|---|---|---|
| 3,242,391 | 3/1966 | Gorman | 357/67 |
| 3,490,140 | 1/1970 | Knight et al. | 357/67 |
| 3,684,930 | 1/1974 | Collins et al. | 357/67 |
| 3,711,745 | 1/1974 | Moroney | 357/67 |
| 3,855,613 | 12/1974 | Napoli et al. | 357/22 |
| 3,898,353 | 8/1975 | Napoli et al. | 357/67 |
| 3,914,785 | 10/1975 | Ketchow | 357/67 |
| 4,011,583 | 3/1977 | Levinstein | 357/71 |

*Primary Examiner*—Andrew J. James
*Attorney, Agent, or Firm*—Michael J. Urbano

[57] ABSTRACT

A nonalloyed ohmic contact (110–112, 120–122) to an n-type Group III(a)-V(a) compound semiconductor body (102–104) is formed by epitaxially growing a Group III(a)-V(a) n++-layer (106–108, 106'–108') doped to at least $10^{19}$ cm$^{-3}$ between the semiconductor body and a metal contact layer (110–112). The metal layer forms an ohmic contact without requiring heating above the eutectic temperature. In order to avoid contamination of the metal-semiconductor interface, a metal contact layer (120–122) may be deposited in situ after MBE growth of the n++-layer. This technique results in both a metal-semiconductor interface with smoother morphology and also an ohmic contact without heating above the eutectic temperature. These procedures are specifically described with reference to the fabrication of GaAs FETs.

11 Claims, 2 Drawing Figures

NONALLOYED OHMIC CONTACTS TO N-TYPE GROUP III(A)-V(A) SEMICONDUCTORS

BACKGROUND OF THE INVENTION

This invention relates to the fabrication of ohmic contacts to Group III(a)-V(a) compound semiconductors.

The problems associated with making ohmic contacts to Group III(a)-V(a) semiconductor devices, such as GaAs field effect transistors (FETs), are many and varied. As pointed out by W. T. Anderson et al (J. Appl. Phys., Vol. 49, No. 5, pp. 2998–3000, May 1978), ohmic contacts of commercially available GaAs FETs typically show island formation on the surface, deteriorate on aging, yield reproducibly low resistances only with difficulty, require critically short alloying times, and exhibit cracking and enhanced diffusion as a result of strain.

The critically short alloying times alluded to by Anderson et al are related to the common practice of evaporating eutectic alloys, such as Au-Ge, on n-type GaAs. Because the alloy as deposited forms a Schottky barrier, the contact is heated above the eutectic temperature (about 360° C. for Au-Ge) for as short a time as possible to melt the alloy and transform the rectifying contact into an ohmic one. This alloying procedure is also commonly used in the fabrication of ohmic contacts (e.g., using Sn-Pd-Au alloys) to n-type layers of GaAs semiconductor lasers. In contrast, the fabrication of ohmic contacts to p-type GaAs is much simpler and requires no alloying because most metals do not form Schottky barriers on p-type GaAs or other p-type Group III(a)-V(a) compounds, but rather form ohmic contacts directly.

SUMMARY OF THE INVENTION

We have discovered that alloying eutectic contacts, such as Au-Ge, to n-type GaAs causes spikes of metal approaching 2000 Angstroms in depth to penetrate into the underlying GaAs. We believe that these spikes can cause premature device failure if the spikes penetrate to the device active region; e.g., premature burn-out of high power FETs if they penetrate to the channel.

It is, therefore, an object of our invention to make a nonalloyed ohmic contact to n-type Group III(a)-V(a) compounds, such as GaAs; that is, an ohmic contact which does not require melting of a eutectic.

In accordance with one embodiment of our invention, an ohmic contact to an n-type zone of a Group III(a)-V(a) device is made by interposing a single crystal Group III(a)-V(a) n++-type layer doped to at least $10^{19}$ cm$^{-3}$ between that zone of the device and a metal electrode. The highly doped layer is substantially lattice-matched to the underlying semiconductor zone of the device, and preferably is fabricated by molecular beam epitaxy (MBE) using Sn doping at a growth temperature which avoids surface segregation of Sn (e.g., $\lesssim 550°$ C. for Sn-doped GaAs). Nonalloyed ohmic contacts may also be formed on layers grown with surface segregation of Sn. However, the actual carrier concentration in the n++-layer would then be difficult to control. In a specific example of this embodiment, MBE was used to grow GaAs n++-layers doped with Sn to about $5 \times 10^{19}$ cm$^{-3}$ under the source and drain electrodes and on the n-type channel layer of a GaAs power FET. Au-Ge ohmic contacts were evaporated onto the heavily doped GaAs layers without alloying; i.e., without exceeding the eutectic temperature. This technique improved the surface morphology at the metal-semiconductor interface to the extent that features (i.e., spikes) were less than 0.1 μm in depth.

Another aspect of our invention involves in situ metallization of the ohmic contacts; that is, following the MBE growth of the highly doped Group III(a)-V(a) n++-type layer, a metal layer is deposited directly thereon at a reduced growth temperature without removing the sample from the MBE ultra high vacuum (UHV) chamber. This procedure insures an atomically clean metal-semiconductor interface and results in ohmic contacts directly. Illustratively, Sn layers 500–2000 Angstroms thick were deposited in situ to form source and drain contacts on GaAs layers doped n++-type to about $5 \times 10^{19}$ cm$^{-3}$ in GaAs power FETs. Because of the somewhat reactive nature of Sn to processing chemicals, other metals deposited in situ may be more suitable, e.g., Au, Pt, Mo, Ta or Ti. A semi-metal such as Ge-As co-deposited in situ may also be advantageous since it provides a good lattice match to the highly doped GaAs layer and may be made to have a Ge concentration as high as $10^{21}$ cm$^{-3}$.

BRIEF DESCRIPTION OF THE DRAWING

Our invention, together with its various features and advantages, can be readily understood from the following more detailed description taken in conjunction with the accompanying drawing, in which.

DETAILED DESCRIPTION

Figure 1:
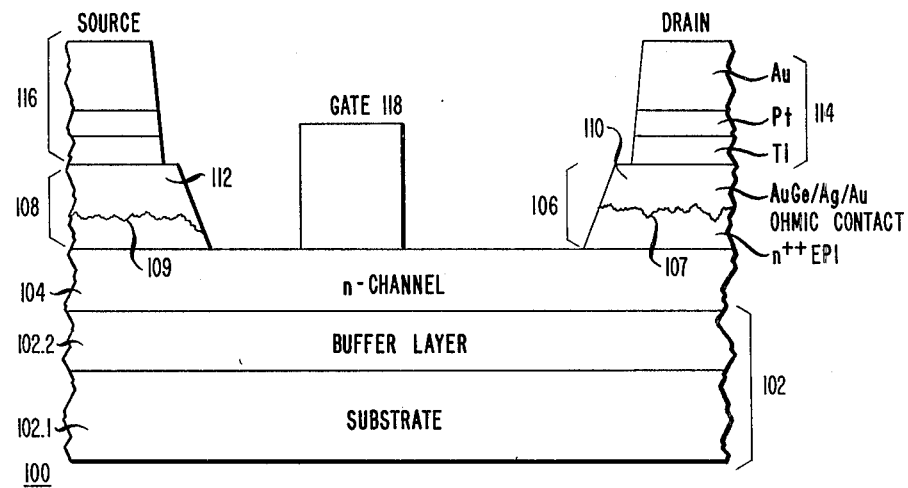
FIG. 1 is a schematic of a GaAs power FET incorporating nonalloyed, ohmic source and drain contacts evaporated onto MBE-grown, highly doped GaAs layers and heated below the eutectic temperature.

With reference now to FIG. 1, a power FET 100 fabricated from a Group III(a)-V(a) compound, typically GaAs, is shown schematically. The FET comprises a semi-insulating semiconductor body 102, an n-type channel layer 104, a pair of n++-type mesa contact zones 106 and 108 doped to at least $10^{19}$ cm$^{-3}$ which define the source and drain regions, nonalloyed ohmic contacts 110 and 112 formed on zones 106 and 108, respectively, multilayered contacts 114 and 116 formed on contacts 110 and 112, respectively, and gate contact 118 formed on channel layer 104 between the source and drain. Typically the mesa contact zones 106 and 108, as well as contacts 114, 116 and 118, have the shape of stripes which extend perpendicular to the plane of the paper.

The semiconductor body 102 includes a semi-insulating substrate 102.1 and, depending on the growth procedure used and the quality of the substrate surface, may also include an optional, low conductivity buffer layer 102.2.

In power FETs the ability of the source and drain contacts to carry relatively high currents is important. To this end, multilayered contacts 114 and 116 serve to increase the cross-sectional area of the mesa stripes and hence also increase the current-carrying capacity of the FET.

Because contacts 110 and 112 are ohmic without requiring heating above the eutectic temperature, the usual difficulties of controlling the morphology and penetration of the alloy are essentially eliminated. In fact, in examples to be discussed, SEM photographs of the metal-semiconductor interfaces 107 and 109 showed local sites less than 0.1 μm deep, whereas in a corresponding prior art device having alloyed contacts the metal-semiconductor interfaces had features approaching 0.2 μm in depth.

Although the use of the highly doped contact zones 106 and 108 themselves enable the realization of ohmic contacts without alloying, in some cases heating to a temperature less than the eutectic temperature may be required to convert slightly rectifying contacts to ohmic ones. As a consequence of nonalloying, however, the surface morphology of the metal-semiconductor interface is much smoother than that of the prior art.

Even smoother interface morphology and the direct formation of ohmic contacts without the need for heating as above, can be realized by depositing in situ a suitable metal or semi-metal layer after MBE growth of the $n^{++}$-layers 106 and 108. The expression in situ means that the metal layer is deposited in the MBE chamber without breaking the vacuum or substantially increasing the chamber pressure. This step insures that the top surface of the $n^{++}$-layer 106 is not subject to atmospheric contamination as would be the case if it were taken from the MBE UHV chamber and transported to a standard evaporation chamber for metal deposition.

Figure 2:
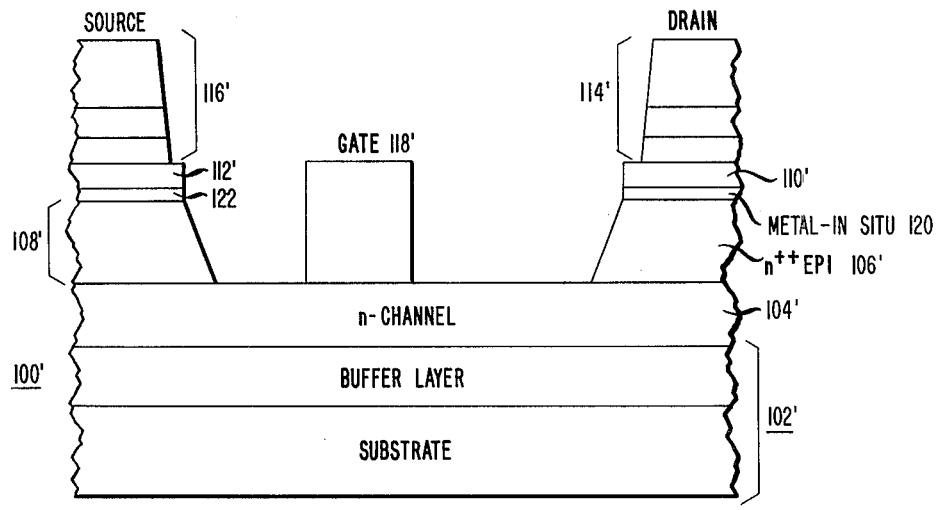
FIG. 2 is a schematic of another GaAs power FET incorporating nonalloyed, ohmic source and drain contacts deposited in situ onto MBE-grown, highly doped GaAs layers.

A power FET 100' fabricated by this in situ metallization technique is shown in FIG. 2 where components corresponding to those of FIG. 1 have been given identical reference numbers but with primed notation. Since much of the two structures is identical, only the differences will be pointed out; to wit, after MBE growth of $n^{++}$-layers 106' and 108', in situ metal (or semi-metal) layers 120 and 122 are deposited thereon without breaking the vacuum of the MBE chamber. This step results in ohmic contacts directly without heating and especially without alloying. SEM photographs of the metal-semiconductor interface exhibited even smoother morphology than that of FIG. 1. Although this structure has been realized by depositing Sn in situ to form layers 120 and 122, other metals, such as Au, Pt, Mo, Ta and Ti, or semi-metals, such as Ge-As, may be more suitable depending on device design and performance considerations.

The following examples are given by way of illustration only. Specific parameters utilized should not be construed as limitations upon the scope of the invention unless otherwise expressly stated.

EXAMPLE I

An exemplary embodiment of the FET of FIG. 1 comprised a Cr-doped GaAs (100) substrate 102.1 obtained from commercial sources, an unintentionally doped (slightly p-type at about $2 \times 10^{14}$ cm$^{-3}$) GaAs buffer layer 102.2 about 1-2 μm thick grown by MBE, an n-type GaAs channel layer 104 about 0.3-0.6 μm thick grown by MBE and doped with Sn to about $8 \times 10^{16}$ cm$^{-3}$, $n^{++}$-GaAs mesa zones 106 and 108 about 0.2-0.35 μm thick grown by MBE and doped with Sn to about $5 \times 10^{19}$ cm$^{-3}$, AuGe-Ag-Au ohmic contacts 110 and 112 evaporated onto zones 106 and 108, and Ti-Pt-Au contacts 114 and 116 evaporated onto contacts 110 and 112. Gate contact 118 was made of Al.

A substantially identical FET was fabricated employing chemical vapor deposition (CVD) to grow both buffer layer 102.2 from GaAs doped with Cr and channel layer 104 from GaAs doped with S to about $8 \times 10^{16}$ cm$^{-3}$. In this case, the channel layer 104 was subjected to standard chemical cleaning, such as rinsing in trichloroethane, acetone and methanol, and immersing in HCl for 20 seconds to remove any oxides before mounting in the MBE UHV chamber.

The MBE apparatus, including UHV chamber, effusion cells and the like, used for the growth of an $n^{++}$-GaAs layer (from which contact zones 106 and 108 will be formed) is well known in the art. We used a Ga effusion cell heated to 980° C.; an As effusion cell heated to 350° C. and a Sn effusion cell heated to 950° C. to give a growth rate of about 1 μm/hr and a carrier concentration as high as $5 \times 10^{19}$ cm$^{-3}$. The reason that MBE can produce n-type GaAs layers with a carrier concentration higher than most conventional growth techniques is that the incorporation of the dopant is not limited by solubility or thermodynamic equilibrium conditions, but is governed by surface kinetics.

For both cases (channel layer 104 grown by CVD and by MBE), the MBE growth surface was first heated to 600° C. for 15 seconds in the UHV chamber at about $10^{-9}$ Torr to obtain a clean GaAs surface. The deposition of the $n^{++}$-GaAs layer was then carried out at a substrate temperature of 530° C. to avoid surface segregation of Sn. The thickness of this layer ranged from 2000 Angstroms to 3500 Angstroms.

After completion of MBE growth of the $n^{++}$-layer doped with Sn to $>10^{19}$ cm$^{-3}$, the wafer was removed from the UHV chamber and subjected to the following process steps: (1) conventional evaporation of a AuGe-Ag-Au multilayer contact over the $n^{++}$-layer; (2) ion-milling to form source and drain metallization stripes from the AuGe multilayer contact; (3) ion-milling or chemical etching to form stripe mesa contact zones 106 and 108 from the $n^{++}$-layer; and (4) conventional evaporation of multilayered Ti-Pt-Au contacts 114 and 116.

EXAMPLE II

Essentially the same procedures as described in Example I were followed through the MBE growth of the $n^{++}$-GaAs layer, but, before evaporating the AuGe contact and without removing the wafer from the UHV system, the substrate temperature was lowered from 530° C. to room temperature by reducing the substrate heater current to zero. At the same time, the Sn effusion cell temperature was raised to 1100° C. to give a Sn deposition rate of about 50 Angstroms/min, and the Ga and As effusion cells were shuttered closed and cooled to terminate the Ga and As molecular beams. The deposition of a Sn layer (from which Sn contacts 120 and 122 of FIG. 2 would be formed) on the $n^{++}$-layer began as the substrate temperature dropped to about 150° C. and was completed near room temperature. Beginning Sn deposition at 150° C. or ending at room temperature is not critical, however. We simply desired to reduce the waiting time and hence the likelihood of contaminating the $n^{++}$-layer surface even though the wafer was still in the UHV system. Various thicknesses of the Sn layer, ranging from 500-2000 Angstroms, were used.

After completion of the Sn deposition, the wafer was subjected to the same four metallization and processing steps described in Example I except no heating at all was required to form the ohmic contact. Ion-milling step (2) was effective to form contact stripes 120 and 122 from the Sn layer as well as stripes 110' and 112' from the AuGe layer.

Experimental Results

We compiled data on wafers in which a AuGe-Ag-Au ohmic contact was deposited (1) on an n++-GaAs contact layer having a carrier concentration of $>10^{19}$ cm$^{-3}$ as shown in FIG. 1 and (2) on top of an in situ deposited Sn layer as shown in FIG. 2. For reference we compared these data with the properties of a standard wafer in which an alloyed AuGe-Ag-Au ohmic contact was evaporated onto a $2\times10^{18}$ cm$^{-3}$ GaAs layer grown by CVD.

The comparison was made using the following parameters: $V_{500}$, the voltage required to obtain 500 ma/mm in 100 μm wide ohmic contact test cells spaced 10 μm apart on the wafer for the as-deposited contact; the temperature and time of the heating cycles which the contact received after deposition; and the $V_{500}$ quantity after these heating cycles.

For the standard wafer the as-deposited contact was rectifying with a blocking potential of 3–5 V, which is consistent with that expected for a Schottky barrier breakdown on a $2\times10^{18}$ cm$^{-3}$ epitaxial GaAs layer. After alloying to 420° C. (eutectic temperture~360° C.), the contacts became ohmic and the $V_{500}$ voltage dropped to 0.55–0.63 V, or 10–11 Ω, which is typical for alloyed ohmic contacts and the sheet resistance of the epitaxial layers used for this device.

For five wafers in which the AuGe-Ag-Au contact was deposited on $>10^{19}$ cm$^{-3}$ Sn-doped GaAs (FIG. 1), we observed the following:

(1) Two of the five wafers had linear (ohmic) contacts as deposited with $V_{500}=0.37–0.62$ V for one and $V_{500}=0.93–1.05$ V for the other.

(2) Three of the five wafers had rectifying contacts as deposited with $V_{500}=0.6–0.8$ V for the first, 0.9–1.0 V for the second, and 1.05–1.3 V for the third; and (3) The three wafers with rectifying contacts all became linear with $V_{500}<1$ V after heating to temperatures of 300° C./15 sec. to 350° C./spike, both of which are below the eutectic temperature of AuGe (~360° C.). The term spike as used herein means a very short duration of about 1 sec. After heating, $V_{500}$ became 0.60 V for the first wafer, 0.55–0.64 V for the second and 0.52–0.92 V for the third.

Point (3) above is quite important since this result implies that ohmic contacts can be obtained without melting the AuGe eutectic.

Another set of data was taken for two wafers in which a Sn layer was deposited in situ and then AuGe was metallized as shown in FIG. 2. We observed the following:

(1) Both of the wafers as deposited had linear (ohmic) current-voltage characteristics; one had $V_{500}=1.5–1.6$ V and the other had $V_{500}=0.58–1.0$ V; and (2) Both of the wafers improved with heating at 250° C./spike to yield $V_{500}=1.0$ V and $V_{500}=0.37–0.90$ V, respectively.

This result clearly indicates that the in situ deposited Sn layer forms a good ohmic contact and that the contact quality is improved with heating at temperatures below the Au-Sn eutectic.

In order to obtain more detailed data on the contacts, the method of Shockley was used in which the contact resistance, $R_c$ is given by $$R_c = L_T^2 R_s, \quad (1)$$

where $R_s$ is the sheet resistance of the n++-GaAs layer and $L_T$ is the transfer length.

A plot of the resistance between contact test cells 100 μm wide and variable spacing L was made. Extrapolation to zero resistance gave $2L_T$. A value for the sheet resistance of the n++-layer was calculated and the $R_c$ derived. Resistance was plotted as a function of various spacings of the contact test cells for different samples. The change in slope for various samples suggested that the measured resistance may be limited by the sheet resistance.

An alternative way of defining the contact resistance was to assume at L=0 that $$R_{meas} = 2R_{contact} + 2R_{probe}. \quad (2)$$

By correcting for total probe resistance, 3 Ω in our case, a value for the resistance per unit length, $R_L$, of a stripe geometry contact in Ω-mm was derived. This value is useful in the design and modeling of GaAs FETs. The following data was obtained:

|  | $L_T$ | $R_c$ | $R_L$ |
|---|---|---|---|
| standard wafer, alloyed AuGe | 2.5 μm | $6\times10^{-6}$ Ω-cm$^2$ | 0.25 Ω-mm |
| Sn layer in situ as deposited on GaAs $10^{19}$ cm$^{-3}$ | 7.5->10 μm | $\approx 10^{-6}$ | 0.15–0.23 Ω-mm |
| Sn in situ, as above, but heated to 250° C. for 1 sec. | 9.0->10 μm | $\approx 10^{-6}$ | 0.06–0.21 Ω-mm |

This table indicates that the resistance $R_L$ for devices of the type depicted in FIG. 2 are either comparable to or less than that of the standard wafer.

In addition to the resistance measurements, scanning electron micrographs of various ohmic contacts showing the morphology of the metal-semiconductor interfaces were also made. The SEM photographs were taken at a grazing angle of 15 degrees to the surface after the chip was mounted upside down in wax and the GaAs etched away leaving only the contacts themselves. The 420° C. standard alloyed contact showed local sites approaching 0.2 μm in depth while the nonalloyed contacts of FIGS. 1 and 2 had a much smoother morphology (<0.1 μm deep features).

As a measure of device quality of power FETs, 6 mm wide devices of the type shown in FIG. 1 were deliberately burned out by applying DC voltage to the device with RF drive on the gate (0.63 W). For one wafer the burn-out voltage was 48±3 V and the drain current ranged from 200 to 275 mA at burn-out. A second wafer had 37±1 V and 600 mA at burn-out. The following points were worthy of note: (1) The values of burn-out voltage were within the distribution of the best data we have obtained for standard wafers with alloyed ohmic contacts; (2) Although the data was limited, the distribution of burn-out voltage was tighter than normally seen for alloyed contacts; and (3) As with alloyed contacts, higher drain current led to lower burn-out voltages.

We also investigated the RF properties of devices of the type shown in FIG. 1 and of a standard alloyed ohmic contact wafer. The RF performance of FIG. 1 devices was excellent—for drain currents ranging from 190 to 600 mA (drain voltage 14 V) the power at 3 dB ranged from 1.1 to 4.5 W and the gain at 0.63 W RF input power ranged from 2.4 to 8.0, indicating no degradation due to the nonalloyed contacts or growth procedures. In contrast, the best standard wafer had powers of 5.1–5.5 W and gains of 7.6–7.9 with the drain at 14 V but for much higher drain currents of 730–950 mA. Thus, comparable gains were achieved in these FETs in accordance with our invention but required 200–350 mA less drain current.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention. In particular, our invention is applicable to the fabrication of discrete devices as well as integrated circuits. For an LSI in which some devices require ohmic contacts but others require rectifying (e.g., Schottky barrier) contacts, we contemplate that the $n^{++}$-contact layer can be selectively formed on only those areas where ohmic contacts are desired. For example, suitable masks can be used during MBE growth to allow the $n^{++}$-layer to grow on only preselected zones of a wafer so that subsequent metallization will form ohmic contacts on the $n^{++}$-zones but Schottky barrier contacts where the $n^{++}$ zones are absent. Alternatively, the preselected $n^{++}$-zones could be formed by etching, ion-milling or otherwise removing portions of an $n^{++}$-layer grown over the entire wafer. And, as mentioned previously, our invention is applicable to the formation of ohmic contacts of other metals such as Ti which in the prior art forms a Schottky barrier on p-type Group III(a)-V(a) materials such as GaAs. An example of a Ti ohmic contact on GaAs follows.

EXAMPLE III

Using MBE, a conventional high conductivity GaAs buffer layer was grown on a (100) GaAs wafer doped n-type with Te to $2 \times 10^{18}$ cm$^{-3}$. Then an $n^{++}$-layer of GaAs about 6000 Angstroms thick was grown on the buffer layer at a growth temperature of 550° C. and Ga, Sn and As$_4$ arrival rates of $5 \times 10^{14}$, $1 \times 10^{12}$ and $2 \times 10^{15}$ cm$^{-2}$ sec., respectively. After thinning and cleaning, the wafer was loaded in a standard vacuum station and was metallized by sputtering 1000 Angstroms of Ti onto the $n^{++}$-layer followed by 1500 Angstroms of Pt onto the Ti layer.

Depending on the doping level of the $n^{++}$-layer, the Ti contacts were either ohmic (at $6 \times 10^{19}$ cm$^{-3}$ in the $n^{++}$-layer), slightly nonlinear (at $1 \times 10^{19}$ cm$^{-3}$) but adequate for some applications, or nonlinear or rectifying (at $1 \times 10^{18}$ cm$^{-3}$). Thus, Ti ohmic contacts on n-GaAs were realized without heating of any kind, and certainly without heating above the eutectic temperature. These ohmic contacts had a specific contact resistance of about $1.9 \pm 0.2 \times 10^{-6}$ $\omega$-cm$^2$.

This type of Ti-Pt ohmic contact is typically employed to make ohmic contact to the p-type layers of a GaAs-AlGaAs DH laser. Our invention enables the same ohmic contact to be made to the n-layers on the opposite side of the laser, thus relieving contact strain which would be produced by different metallization.

We claim:

1. A device comprising
   an n-type body of a Group III(a)-V(a) compound semiconductor material,
   an $n^{++}$-layer of a Group III(a)-V(a) compound semiconductor material epitaxially grown on said body and substantially lattice-matched thereto, said layer having a carrier concentration in excess of $10^{19}$ cm$^{-3}$, and
   a nonalloyed, ohmic metal contact formed on said $n^{++}$-layer.

2. The device of claim 1 wherein said body and said layer comprise GaAs.

3. The device of claim 2 wherein said layer is doped with Sn.

4. The device of claims 1 or 2 wherein said contact comprises a metal selected from the group consisting of Au, Sn, Pt, Mo, Ta, Ti and AuGe.

5. The device of claims 1, 2, 3 or 4 wherein said $n^{++}$-layer is epitaxially grown by MBE and said contact is deposited in situ after said layer is grown.

6. A field effect transistor comprising
   a semi-insulating semiconductor body of a Group III(a)-V(a) compound material,
   an n-type epitaxial channel layer of said material epitaxially grown on said body,
   a pair of stripe mesa $n^{++}$-type source and drain zones of said material epitaxially grown on said channel layer and doped to a carrier concentration in excess of $10^{19}$ cm$^{-3}$,
   nonalloyed, ohmic, metal source and drain contacts formed on said zones, and
   a metal gate contact formed on said channel layer and between said zones.

7. The transistor of claim 6 wherein
   said material comprises GaAs, and
   said source and drain contacts comprise a layer of metal selected from the group consisting of Au, Sn, Pt, Mo, Ta, Ti and AuGe.

8. The transistor of claim 6 wherein said source and drain contacts comprise AuGe-Ag-Au.

9. The transistor of claims 6, 7, or 8 wherein said $n^{++}$-type zones are epitaxially grown by MBE in the form of a unitary layer, said source and drain contacts are deposited in situ in the form of a unitary layer, and said source and drain $n^{++}$-type zones and ohmic contacts are formed by shaping said unitary layers.

10. A method of forming a nonalloyed, ohmic contact on an n-type body of a Group III(a)-V(a) compound semiconductor material comprising the steps of
    (a) epitaxially growing an $n^{++}$-layer of said material on said body so as to have a carrier concentration in excess of $10^{19}$ cm$^{-3}$, and
    (b) depositing a metal layer on said $n^{++}$-layer without heating above the eutectic temperature, thereby forming said ohmic contact.

11. The method of claim 10 wherein
    step (a) includes growing said $n^{++}$-layer by MBE, and
    step (b) includes depositing said metal layer in situ after said $n^{++}$-layer is grown.

* * * * *